US012748148B2

(12) United States Patent
Yao et al.

(10) Patent No.: US 12,748,148 B2
(45) Date of Patent: Sep. 29, 2026

(54) METHOD AND APPARATUS FOR DETERMINING AN INDIVIDUAL MOTOR PARAMETER, ELECTRONIC DEVICE, AND STORAGE MEDIUM

(71) Applicant: AAC Acoustic Technologies (Shanghai) Co., Ltd., Shanghai (CN)

(72) Inventors: Shuhan Yao, Shanghai (CN); Yajun Zheng, Shanghai (CN); Xiaojie Shao, Shanghai (CN); Yulei Zhang, Shanghai (CN)

(73) Assignee: AAC Acoustic Technologies (Shanghai) Co., Ltd., Shanghai (CN)

( * ) Notice: Subject to any disclaimer, the term of this patent is extended or adjusted under 35 U.S.C. 154(b) by 282 days.

(21) Appl. No.: 18/409,755

(22) Filed: Jan. 10, 2024

(65) Prior Publication Data

US 2025/0020722 A1 Jan. 16, 2025

Related U.S. Application Data

(63) Continuation of application No. PCT/CN2023/130184, filed on Nov. 7, 2023.

(30) Foreign Application Priority Data

Jul. 12, 2023 (CN) ......................... 202310855933.8

(51) Int. Cl.
*G01R 31/34* (2020.01)

(52) U.S. Cl.
CPC .................................. *G01R 31/343* (2013.01)

(58) Field of Classification Search
CPC .................................................... G01R 31/343
USPC ..................................................... 324/765.01
See application file for complete search history.

(56) References Cited

U.S. PATENT DOCUMENTS 6,014,598 A * 1/2000 Duyar .................. G01R 31/343 701/33.9
6,323,658 B1 * 11/2001 Kendig ................ G01R 31/343 324/551
8,561,463 B2 * 10/2013 Baehr ..................... G01M 1/22 73/462
2012/0136593 A1 * 5/2012 Donaldson ........... G01R 31/343 702/60
2014/0236501 A1 * 8/2014 Mao .................... H02P 29/0241 702/58
2021/0399613 A1 * 12/2021 Rahman ................. H02K 11/20
(Continued)

FOREIGN PATENT DOCUMENTS

EP 4160233 A1 * 4/2023 ........... G01R 31/343

*Primary Examiner* — Arleen M Vazquez
*Assistant Examiner* — Robert P Alejnikov, Jr.
(74) *Attorney, Agent, or Firm* — Wiersch Law Group

(57) ABSTRACT

Provided are a method and apparatus for determining an individual motor parameter, an electronic device, and a storage medium. The method includes: testing a first motor parameter of a target type of a current motor in a motor assembly phase, and acquiring a motor parameter set saved in a motor manufacturing phase; calculating a difference evaluation index between the first motor parameter and a second motor parameter of the corresponding type in the motor parameter set; and determining all motor parameters in the motor parameter set to be effective individual motor parameters if the difference evaluation index is less than or equal to a preset index threshold.

8 Claims, 4 Drawing Sheets

(56) References Cited

U.S. PATENT DOCUMENTS

| | | | | |
|---|---|---|---|---|
| 2022/0221514 | A1* | 7/2022 | Osokin | G07C 3/146 |
| 2022/0389912 | A1* | 12/2022 | Paietta | F03D 7/028 |

* cited by examiner

METHOD AND APPARATUS FOR DETERMINING AN INDIVIDUAL MOTOR PARAMETER, ELECTRONIC DEVICE, AND STORAGE MEDIUM

TECHNICAL FIELD

The present disclosure relates to the technical field of micro-electro-mechanical system, and in particular, to a method and apparatus for determining an individual motor parameter, an electronic device, and a storage medium.

BACKGROUND

A general motor control algorithm is typically based on a set of universal parameters associated with a motor type. However, even if motors are from a same batch, large individual differences still exist. In order to be compatible with such individual differences in the motors, output of the algorithm may always be in a relatively conservative state to ensure that all the motors have relatively stable vibration performance. However, this solution has the following significant shortcomings.

Firstly, in order to be compatible with the individual differences in the motors and prevent certain risks, the overall motor control algorithm may be relatively conservative. Then, some motors with stronger capabilities cannot fulfill their performance, resulting in a huge waste of performance.

Secondly, since the algorithm does not make additional adjustments for individual motors, output of the motor control algorithm on different motors is similar. Due to differences in capabilities of motors caused by differences in individual parameters of motors, actual vibrations of the motors may show significant differences, which may lead to significant fluctuations in performance of the entire batch of motors on the actual algorithm, greatly affect actual experience, hindering frame customization and reducing a motor yield.

Therefore, the motor control algorithm based on universal parameters needs improvement.

SUMMARY

An objective of the present disclosure is to provide method and apparatus for determining an individual motor parameter, an electronic device, and a storage medium, which can solve at least the problem in the related art that the universal motor parameters cannot be used to adaptively adjust technical parameters based on individual differences in motors, resulting in low motor control accuracy and failure of achieving the expected product effect.

In order to achieve the above objective, in a first aspect of the present disclosure, a method for determining an individual motor parameter is provided, including:

- testing a first motor parameter of a target type of a current motor in a motor assembly phase, and acquiring a motor parameter set saved in a motor manufacturing phase;
- calculating a difference evaluation index between the first motor parameter and a second motor parameter of the corresponding type in the motor parameter set; and
- determining all motor parameters in the motor parameter set to be effective individual motor parameters if the difference evaluation index is less than or equal to a preset index threshold.

In a second aspect of the present disclosure, an apparatus for determining an individual motor parameter is provided, including: an acquisition module, a calculation module, and a determination module.

The acquisition module is configured to test a first motor parameter of a target type of a current motor in a motor assembly phase, and acquire a motor parameter set saved in a motor manufacturing phase;

The calculation module is configured to calculate a difference evaluation index between the first motor parameter and a second motor parameter of the corresponding type in the motor parameter set; and The determination module is configured to determine all motor parameters in the motor parameter set to be effective individual motor parameters if the difference evaluation index is less than or equal to a preset index threshold.

In a third aspect of the present disclosure, an electronic device is provided, including: a memory and a processor. The processor is configured to execute a computer program stored in the memory, and the processor, when executing the computer program, performs the method provided in the first aspect of the present disclosure.

In a fourth aspect of the present disclosure, a non-transitory computer-readable storage medium, storing a computer program. When the computer program is executed by a processor, the method provided in the first aspect of the present disclosure is performed.

BRIEF DESCRIPTION OF DRAWINGS

In order to more clearly illustrate the technical solutions in embodiments of the present invention or the prior art, the accompanying drawings used in the description of the embodiments or the prior art will be briefly introduced below. It is apparent that, the accompanying drawings in the following description are only some embodiments of the present invention, and other drawings can be obtained by those skilled in the art from the provided drawings without creative efforts.

DESCRIPTION OF EMBODIMENTS

In order to make the inventive objectives, features, and advantages of the present disclosure more obvious and understandable, the technical solutions in the embodiments of the present disclosure will be described clearly and completely below with reference to the accompanying drawings in the embodiments of the present disclosure. It is apparent that the described embodiments are merely some of rather than all of the embodiments of the present disclosure. All other embodiments acquired by those skilled in the art without creative efforts based on the embodiments in the present disclosure shall fall within the protection scope of the present disclosure.

In addition, the terms "first" and "second" are used for descriptive purposes only, which cannot be construed as indicating or implying a relative importance, or implicitly specifying the number of the indicated technical features. Therefore, the features defined with "first" and "second" may explicitly or implicitly include one or more features. In the description of the embodiments of the present disclosure, "a plurality of" means two or more, unless specifically stated otherwise.

Figure 1:
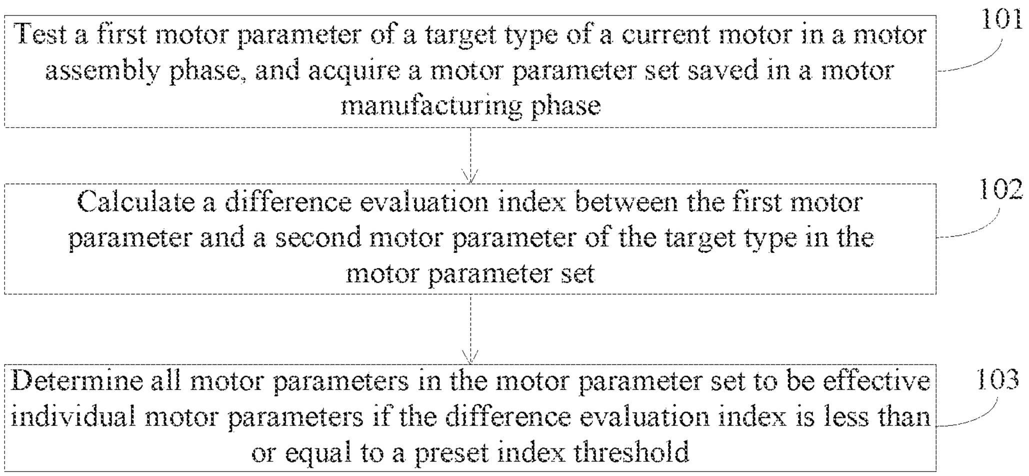
FIG. 1 is a flowchart of a method for determining an individual motor parameter according to a first embodiment of the present disclosure.

The legacy method based on universal motor parameters cannot adaptively adjust technical parameters based on individual differences in motors, resulting in low motor control accuracy and failure of achieving the expected product effect. In a first embodiment of the present disclosure, a method for determining an individual parameter of a motor is provided. FIG. 1 is a flowchart of the method for determining an individual parameter of a motor provided in this embodiment. The method for determining an individual parameter of a motor includes the following steps.

In step 101, a first motor parameter of a target type of a current motor is tested in a motor assembly phase, and a motor parameter set saved in a motor manufacturing phase is acquired.

Since data saving, motor installation, and data reading in the motor manufacturing phase are performed at different times, a data error may occur. In this embodiment, a certain motor parameter of a type of the current motor may be selected as a test object for testing, and the motor parameter set corresponding to the motor saved in the motor manufacturing phase is acquired.

In some embodiments, the step of acquiring a motor parameter set saved in a motor manufacturing phase includes: identifying an identifiable graphic tag attached to the current motor, and acquiring the motor parameter set saved in the motor manufacturing phase; or sending a motor parameter acquisition request to a server, and receiving the motor parameter set saved in the motor manufacturing phase that is delivered by the server in response to the motor parameter acquisition request.

In this embodiment, a storage form of the motor parameter set obtained in the manufacturing phase may be selected according to an actual requirement, and the motor parameter set may be saved on a motor housing in the form of a quick response (QR) code, or may be saved in a cloud database. Correspondingly, if the QR code is used, data may be directly stored in the QR code in a certain agreed format. The QR code also stores a unique identity of the motor and other information, and the QR code is sprayed on the motor housing. If the database is used, after the data is acquired, the data needs to be upload to the cloud database in a certain subsequent procedure of a manufacturing line. When there is a need to acquire the motor parameter set during motor installation, the QR code on the motor housing is directly scanned or the motor parameter acquisition request is sent to the server, then, the motor parameter set saved in the motor manufacturing phase that is delivered by the server in response to the motor parameter acquisition request is received, and finally, the received motor parameter set is directly written into a hardware non-volatile random access memory (NVRAM).

In some embodiments, prior to the step of acquiring a motor parameter set saved in a motor manufacturing phase, the method further includes: sending a preset excitation signal to the current motor in the motor manufacturing phase; measuring a motor voltage, a motor current, and a motor acceleration of the current motor driven by the excitation signal; and calculating corresponding motor parameters respectively according to the motor voltage, the motor current, and the motor acceleration, and generating the motor parameter set.

In this embodiment, in order to generate an individual parameter of the motor, a preset excitation signal may be applied to the motor in the motor manufacturing phase, so as to obtain voltages at two ends of the motor, motor acceleration response, and motor current response corresponding to the excitation signal. The obtained motor voltage, motor current, and motor acceleration are used as data sources, actual motor parameters are calculated through specific fitting methods, and a motor parameter set is generated according to the actual motor parameters, so that most accurate parameters for the individual motor can be acquired with a minimum time overhead.

Further, in some embodiments, prior to the step of sending a preset excitation signal to the current motor in the motor manufacturing phase, the method further includes: generating a plurality of test signals according to voltage amplitudes and integer cycles corresponding to different preset motor resonant frequencies; and splicing the plurality of test signals according to a preset cycle interval length to generate the excitation signal.

In this embodiment, in the motor manufacturing phase, a resonant frequency of an individual motor is acquired through an early testing, and a plurality of frequencies such as F0, F0/2, and F0/3 are set based on this resonance frequency. Each frequency is assigned a specific voltage amplitude and a preset integer cycle to generate the plurality of test signals. The test signals may be tone signals or chirp signals. Then, the plurality of test signals at different frequencies are spliced at preset intervals to obtain a spliced signal, and the spliced signal is used as the excitation signal.

In step 102, a difference evaluation index between the first motor parameter and a second motor parameter of the corresponding type in the motor parameter set is calculated.

In this embodiment, in order to improve the accuracy, in the motor installation phase, the feature parameter is calculated with a motor parameter of corresponding type in the motor parameter set, thereby obtaining a difference evaluation index between the two for subsequent processing and reducing a risk caused by error. The first motor parameter may be a motor resonant frequency F0.

In some embodiments, the step of calculating a difference evaluation index between the first motor parameter and a second motor parameter of the corresponding type in the motor parameter set includes: calculating deviation values between a plurality of first motor parameters of different target types and second motor parameters of the corresponding types in the motor parameter set respectively; and performing weighted average calculation on the deviation values to obtain the difference evaluation index.

In this embodiment, a plurality of feature parameters of different target types and corresponding motor parameters in the parameter set of the individual motor may be calculated to obtain a plurality of deviation values, and then weighted average calculation is performed on the plurality of deviation values to obtain the difference evaluation index.

Further, in some embodiments, subsequent to the step of calculating a difference evaluation index between the first motor parameter and a second motor parameter of the corresponding type in the motor parameter set, the method further includes: determining all universal motor parameters in a preset universal motor parameter set to be the effective parameters of the individual motor if the difference evaluation index is greater than the index threshold.

In this embodiment, in consideration of a large time difference in data saving, motor installation, and motor data reading in a motor generation phase, a data error may occur, If the error cannot be correctly identified, fatal performance losses may be brought to the motor. In order to solve this potential problem, in this embodiment, a set of relatively conservative parameters that can be adapted to all motors of this model is used as backup parameters. When the difference evaluation index is greater than an index threshold and it is determined that the individual motor parameter does not match the current motor, the individual motor parameter set is directly discarded and the universal backup parameters are used.

Further, in some embodiments, subsequent to the step of calculating a difference evaluation index between the first motor parameter and a second motor parameter of the corresponding type in the motor parameter set, the method further includes: generating a corresponding parameter modifying model based on the difference evaluation index if the difference evaluation index is greater than the index threshold; and modifying all the motor parameters in the motor parameter set based on the parameter modifying model to obtain the effective individual motor parameters.

In this embodiment, when the difference evaluation index is greater than the index threshold, a corresponding parameter modifying model may alternatively be generated based on the difference evaluation index, and then all the motor parameters in the motor parameter set are modified based on the parameter modifying model, so as to obtain the individual motor parameters without discarding the whole error motor parameter set.

In step 103, all motor parameters in the motor parameter set are determined to be effective individual motor parameters if the difference evaluation index is less than or equal to a preset index threshold.

In this embodiment, if the difference evaluation index is less than or equal to the preset index threshold, it indicates that the motor parameter set matches the current motor, and all the parameters in the motor parameter set are adopted as individual motor parameters of the current motor.

Based on the technical solution in this embodiment of the present disclosure, a first motor parameter of a target type of a current motor is tested in a motor assembly phase, and a motor parameter set stored in a motor manufacturing phase is acquired; a difference evaluation index between the first motor parameter and a second motor parameter of the corresponding type in the motor parameter set is calculated; and all motor parameters in the motor parameter set are determined to be effective individual motor parameters if the difference evaluation index is less than or equal to a preset index threshold. Through the solution of the present disclosure, correctness determination is performed on an acquired motor parameter set, when the acquired motor parameter set is determined to be correct, the acquired motor parameter set is determined to be an effective individual motor parameter, and the accurate individual motor parameter is used to control this individual motor, thereby effectively improving motor control accuracy and making a full use of motor performance to achieve an expected product effect.

Figure 2:
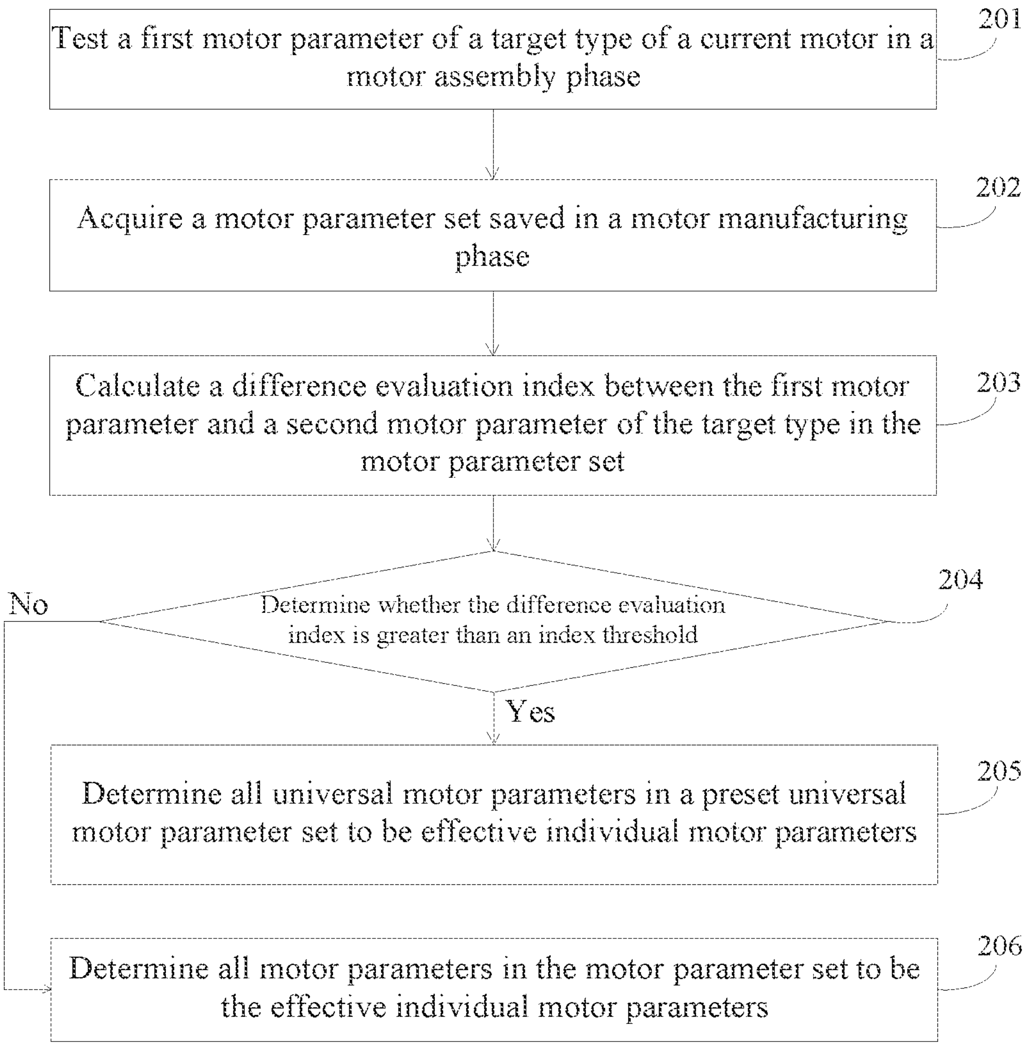
FIG. 2 is a flowchart of a method for determining an individual motor parameter according to a second embodiment of the present disclosure.

FIG. 2 shows a method for determining an individual motor parameter according to a second embodiment of the present disclosure. The method for determining an individual motor parameter includes the following steps.

In step 201, a first motor parameter of a target type of a current motor is tested in a motor assembly phase.

In step 202, a motor parameter set saved in a motor manufacturing phase is acquired.

In this embodiment, in consideration of a large time difference in data saving, motor installation, and data reading in the motor manufacturing phase, a data error may occur, so a certain motor parameter of a type of the current motor may be selected as a test object for testing, and the motor parameter set corresponding to the motor saved in the motor manufacturing phase is acquired.

In step 203, a difference evaluation index between the first motor parameter and a second motor parameter of the corresponding type in the motor parameter set is calculated.

In this embodiment, in order to reduce error, in the installation phase, the feature parameter is calculated with a motor parameter of the corresponding type in the motor parameter set, thereby obtaining a difference evaluation index between the two for corresponding processing and reducing a risk caused by the error. The first motor parameter may be a motor resonant frequency F0.

In step 204, it is determined whether the difference evaluation index is greater than an index threshold; if yes, step 205 is performed, and if not, step 206 is performed.

In step 205, all universal motor parameters in a preset universal motor parameter set are determined as effective individual motor parameters.

In step 206, all motor parameters in the motor parameter set are determined as the effective individual motor parameters.

In this embodiment, in consideration of a large time difference in motor parameter storage, motor installation, and motor parameter reading in the motor manufacturing phase, a data error may occur due to a process error. If the error cannot be identified, the current process may bring fatal performance losses to the motor. In order to solve this potential problem, in this embodiment, a set of relatively conservative parameters that can be adapted to all motors of this model is used as backup parameters, a certain feature parameter of the motor is used as a symbol, the feature parameter of the motor may be detected automatically when the motor is installed in an OEM manufacturing line, and the algorithm may be imported simultaneously. A difference between the feature parameter and the corresponding feature parameter in motor identity recognition (MIR) is compared by the algorithm. If the difference is large, it is determined that the MIR parameter is incorrect, and a default parameter is directly used in the algorithm. If the difference is small, indicating that the motor parameter set matches the current motor, all the motor parameters in the motor parameter set are adopted as individual motor parameters. A motor resonance frequency F0 is the feature parameter. In this embodiment, in the motor manufacturing phase, the most accurate individual motor parameter is acquired with a minimum overhead, and a motor control algorithm is introduced as a basis to achieve more precise control over the motor unit, which solves the problems caused by individual differences in the motors and better fully utilize capabilities of the motors.

It should be understood that sequence numbers of the steps in this embodiment do not mean execution sequences of the steps. The execution sequences of the steps should be determined based on functions and internal logic thereof, and should not constitute an only limitation on the implementation process of the embodiments of the present disclosure.

Based on the technical solution in this embodiment of the present disclosure, a first motor parameter of a target type of a current motor is tested in a motor assembly phase, and a motor parameter set saved in a motor manufacturing phase is acquired; a difference evaluation index between the first motor parameter and a second motor parameter of the corresponding type in the motor parameter set is calculated; it is determined whether the difference evaluation index is greater than an index threshold; if yes, all universal motor parameters in a preset universal motor parameter set are determined to be effective individual motor parameters; and if not, all motor parameters in the motor parameter set are determined to be effective individual motor parameters. Through the solutions of the present disclosure, correctness determination is performed on the acquired motor parameter set. When it is determined that the motor parameter set is correct, the motor parameter set is determined as effective individual motor parameters, and the accurate individual motor parameter is used to control the individual motor, thereby effectively improving motor control accuracy and fully utilizing motor performance to achieve an expected product effect. In addition, in this embodiment, in the motor manufacturing phase, the most accurate individual motor parameter is acquired with a minimum overhead, and a motor control algorithm is introduced as a basis to achieve more precise control over the individual motor, which solves the problems caused by individual differences in the motors and can fully utilizes performance of the motors, thereby preventing a waste of performance of more powerful motors.

Figure 3:
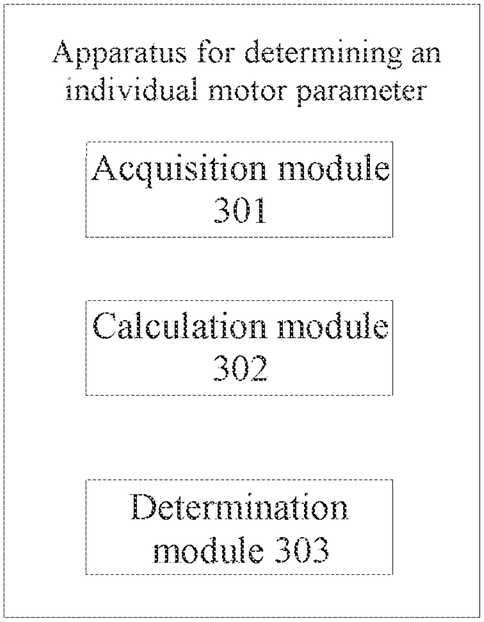
FIG. 3 is a schematic diagram of an apparatus for determining an individual motor parameter according to a third embodiment of the present disclosure.

FIG. 3 shows an apparatus for determining an individual motor parameter according to a third embodiment of the present disclosure. The apparatus may be applied to the foregoing method for determining an individual motor parameter. As shown in FIG. 3, the apparatus includes: an acquisition module 301, a calculation module 302, and a determination module 303.

The acquisition module 301 is configured to test a first motor parameter of a target type of a current motor in a motor assembly phase, and acquire a motor parameter set saved in a motor manufacturing phase.

The calculation module 302 is configured to calculate a difference evaluation index between the first motor parameter and a second motor parameter of the corresponding type in the motor parameter set.

The determination module 303 is configured to determine that all motor parameters in the motor parameter set are effective individual motor parameters if the difference evaluation index is less than or equal to a preset index threshold.

In some embodiments, the acquisition module is configured to identify an identifiable graphic tag attached to the current motor, and acquire the motor parameter set saved in the motor manufacturing phase; or send a motor parameter acquisition request to a server, and receive the motor parameter set saved in the motor manufacturing phase that is delivered by the server in response to the motor parameter acquisition request.

Further, in some embodiments, the apparatus further includes: a measurement module configured to send a preset excitation signal to the current motor in the motor manufacturing phase; measure a motor voltage, a motor current, and a motor acceleration of the current motor driven by the excitation signal; and calculate corresponding motor parameters respectively according to the motor voltage, the motor current, and the motor acceleration, and generate the motor parameter set.

Furthermore, in some embodiments, the apparatus further includes: a splicing module configured to generate a plurality of test signals according to voltage amplitudes and integer cycles corresponding to different preset motor resonant frequencies; and splice the plurality of test signals according to a preset cycle interval length to generate the excitation signal.

In some embodiments, the calculation module is configured to calculate deviation values between a plurality of first motor parameters of different target types and second motor parameters of the corresponding types in the motor parameter set respectively; and perform weighted average calculation on the deviation values to obtain the difference evaluation index.

Further, in some embodiments, the determination module is configured to determine all universal motor parameters in a preset universal motor parameter set to be the effective individual motor parameters if the difference evaluation index is greater than the index threshold.

Further, in some embodiments, the determination module is further configured to generate a corresponding parameter modifying model based on the difference evaluation index if the difference evaluation index is greater than the index threshold; and modify all the motor parameters in the motor parameter set based on the parameter modifying model to obtain the effective individual motor parameters.

It should be noted that the methods for determining the individual motor parameter in the foregoing embodiments may all be implemented based on the apparatus for determining the individual motor parameter provided in this embodiment. Those of ordinary skill in the art can clearly understand that, for the convenience and simplicity of description, a specific operating process of the apparatus described in this embodiment may be obtained with reference to the corresponding process in the foregoing method embodiments. Details are not described herein again.

Based on the technical solution in the above embodiment of the present disclosure, a first motor parameter of a target type of a current motor is tested in a motor assembly phase, and a motor parameter set saved in a motor manufacturing phase is acquired; a difference evaluation index between the first motor parameter and a second motor parameter of the corresponding type in the motor parameter set is calculated; and all motor parameters in the motor parameter set are determined to be effective individual motor parameters if the difference evaluation index is less than or equal to a preset index threshold. Through the solution of the present disclosure, correctness determination is performed on the acquired motor parameter set. When the motor parameter set is determined to be correct, the motor parameter set is determined to be an effective individual motor parameter, and the accurate individual motor parameter is used to control the individual motor, thereby effectively improving motor control accuracy and fully utilizing the motor performance to achieve an expected product effect. In addition, in this embodiment, in the motor manufacturing phase, the most accurate individual motor parameter is acquired with a minimum overhead, and a motor control algorithm is introduced as a basis to achieve more precise control over the individual motor, which solves the problems caused by individual differences in the motors and better utilizes capabilities of the motors.

Figure 4:
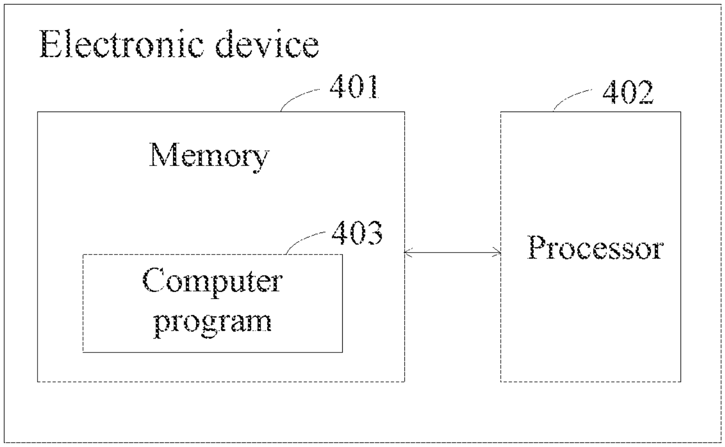
FIG. 4 is a schematic structural diagram of an electronic device according to a fourth embodiment of the present disclosure.

FIG. 4 is a schematic structural diagram of an electronic device according to a fourth embodiment of the present disclosure. The electronic device may be configured to implement the method for determining an individual motor parameter in the foregoing embodiments, and includes: a memory 401, a processor 402, and a computer program 403.

The computer program 403 is stored in the memory 401 and executable by the processor 402. The memory 401 and the processor 402 are in communication connection. The processor 402, when executing the computer program 403, performs the method in the foregoing first or second embodiment. One or more processors may be provided.

The memory 401 may be a high-speed random access memory (RAM), or may be a non-volatile memory such as a magnetic disk memory. The memory 401 is configured to store executable program code, and the processor 402 is coupled to the memory 401.

Further, an embodiment of the present disclosure further provides a non-transitory computer-readable storage medium. The non-transitory computer-readable storage medium may be arranged in the above electronic device. The non-transitory computer-readable storage medium may be the memory in the embodiment shown in FIG. 4.

The non-transitory computer-readable storage medium stores a computer program. When the program is executed by a processor, the method for determining an individual motor parameter in the foregoing embodiments is implemented. Further, the non-transitory computer-readable storage medium may alternatively be any medium that can store program code such as a USB flash disk, a mobile hard disk, a read-only memory (ROM), a RAM, a magnetic disk, or an optical disc.

In the several embodiments provided in the present disclosure, it should be understood that the apparatus and method disclosed may be implemented in other manners. For example, the apparatus embodiments described above are only illustrative. For example, the division of the modules is merely logical function division, and there may be other division manners in an actual implementation. For example, a plurality of modules or components may be combined or integrated into another system, or some features may be ignored or not performed. In addition, the displayed or discussed mutual couplings or direct couplings or communication connections may be implemented by using some interfaces. The indirect couplings or communication connections between apparatuses or modules may be implemented in an electric form, a mechanical form, or other forms.

The modules described as separate parts may or may not be physically separate, and parts displayed as modules may or may not be physical modules, may be located at one position, or may be distributed on a plurality of network modules. Some or all of the modules may be selected according to actual requirements to achieve the objective of the solution of this embodiment.

In addition, the functional modules in the embodiments of the present disclosure may be integrated into one processing module, or each of the modules may exist alone physically, or two or more modules are integrated into one module. The integrated module may be implemented in a form of hardware or in a form of a software functional module.

The integrated module may be stored in a computer-readable storage medium when implemented in the form of the software functional module and sold or used as a separate product. Based on such an understanding, the technical solutions in the present disclosure essentially, or the part contributing to the prior art, or some of the technical solutions may be implemented in the form of a software product. The computer software product is stored in a readable storage medium, and includes several instructions for causing a computer device (which may be a personal computer, a server, a network device, or the like) to perform all or some of the steps of the methods described in the embodiments of the present disclosure. The foregoing storage medium includes: any medium that can store program code, such as a USB flash drive, a removable hard disk, a ROM, a RAM, a magnetic disk, or an optical disc.

It is to be noted that, to make the description brief, the foregoing method embodiments are expressed as a series of actions. However, those skilled in the art should appreciate that the present disclosure is not limited to the described action sequence, because according to the present disclosure, some steps may be performed in other sequences or performed simultaneously. In addition, those skilled in the art should also appreciate that all the embodiments described in the specification are preferred embodiments, and the related actions and modules are not necessarily mandatory to the present disclosure.

In the above embodiments, the descriptions of the embodiments have respective focuses. For a part that is not described in detail in one embodiment, refer to related descriptions in other embodiments. The above are descriptions about the method and apparatus for determining an individual motor parameter, the electronic device, and the storage medium provided in the present disclosure. For those skilled in the art, there may be changes in exemplary embodiments and a scope based on the ideas of the embodiments of the present disclosure. In summary, the content of this specification should not be understood as a limitation on the present disclosure.

What is claimed is:

1. A method for determining an individual motor parameter, comprising:

testing a first motor parameter of a target type of a current motor in a motor assembly phase, and acquiring a motor parameter set saved in a motor manufacturing phase;

calculating a difference evaluation index between the first motor parameter and a second motor parameter of a corresponding type in the motor parameter set; and determining that all motor parameters in the motor parameter set are effective individual motor parameters if the difference evaluation index is less than or equal to a preset index threshold;

generating a corresponding parameter modifying model based on the difference evaluation index if the difference evaluation index is greater than the index threshold; and modifying all the motor parameters in the motor parameter set based on the parameter modifying model to obtain the effective individual motor parameters;

the effective individual motor parameters are used to control the individual motor to vibrate.

2. The method as described in claim 1, wherein the step of acquiring a motor parameter set saved in a motor manufacturing phase comprises:

identifying an identifiable graphic tag attached to the current motor, and acquiring the motor parameter set saved in the motor manufacturing phase.

3. The method as described in claim 1, wherein the step of acquiring a motor parameter set saved in a motor manufacturing phase comprises:

sending a motor parameter acquisition request to a server, and receiving the motor parameter set saved in the motor manufacturing phase that is delivered by the server in response to the motor parameter acquisition request.

4. The method as described in claim 1, prior to the step of acquiring the motor parameter set saved in the motor manufacturing phase, further comprising:

sending a preset excitation signal to the current motor in the motor manufacturing phase;

measuring a motor voltage, a motor current, and a motor acceleration of the current motor driven by the excitation signal; and calculating motor parameters according to the motor voltage, the motor current, and the motor acceleration, and generating the motor parameter set.

5. The method as described in claim 4, prior to the step of sending the preset excitation signal to the current motor in the motor manufacturing phase, further comprising:

generating a plurality of test signals according to voltage amplitudes and integer cycles corresponding to different preset motor resonant frequencies; and splicing the plurality of test signals according to a preset cycle interval length to generate the excitation signal.

6. The method as described in claim 1, wherein the step of calculating the difference evaluation index between the first motor parameter and a second motor parameter of a corresponding type in the motor parameter set comprises:

calculating deviation values between a plurality of first motor parameters of different target types and second motor parameters of corresponding types in the motor parameter set respectively; and performing weighted average calculation on the deviation values to obtain the difference evaluation index.

7. An apparatus for determining an individual motor parameter, comprising:

an acquisition module configured to test a first motor parameter of a target type of a current motor in a motor assembly phase, and acquire a motor parameter set saved in a motor manufacturing phase;

a calculation module configured to calculate a difference evaluation index between the first motor parameter and a second motor parameter of a corresponding type in the motor parameter set; and a determination module configured to determine that all motor parameters in the motor parameter set are effective individual motor parameters if the difference evaluation index is less than or equal to a preset index threshold; generating a corresponding parameter modifying model based on the difference evaluation index if the difference evaluation index is greater than the index threshold; and modifying all the motor parameters in the motor parameter set based on the parameter modifying model to obtain the effective individual motor parameters; the effective individual motor parameters are used to control the individual motor to vibrate.

8. An electronic device, comprising a memory and a processor, wherein the processor is configured to execute a computer program stored in the memory; and the processor, when executing the computer program, performs the method for determining an individual motor parameter, wherein the method comprising:

testing a first motor parameter of a target type of a current motor in a motor assembly phase, and acquiring a motor parameter set saved in a motor manufacturing phase;

calculating a difference evaluation index between the first motor parameter and a second motor parameter of a corresponding type in the motor parameter set; and determining that all motor parameters in the motor parameter set are effective individual motor parameters if the difference evaluation index is less than or equal to a preset index threshold;

generating a corresponding parameter modifying model based on the difference evaluation index if the difference evaluation index is greater than the index threshold; and modifying all the motor parameters in the motor parameter set based on the parameter modifying model to obtain the effective individual motor parameters;

the effective individual motor parameters are used to control the individual motor to vibrate.

* * * * *